United States Patent
Cho et al.

(10) Patent No.: US 9,431,979 B2
(45) Date of Patent: Aug. 30, 2016

(54) METHOD AND APPARATUS FOR EMULATING SOUND

(71) Applicant: SAMSUNG ELECTRONICS CO., LTD., Suwon-si (KR)

(72) Inventors: Jae-yong Cho, Bucheon-si (KR); Hae-kwang Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 585 days.

(21) Appl. No.: 13/673,456

(22) Filed: Nov. 9, 2012

(65) Prior Publication Data

US 2013/0114820 A1     May 9, 2013

Related U.S. Application Data

(60) Provisional application No. 61/557,605, filed on Nov. 9, 2011.

(30) Foreign Application Priority Data

Nov. 6, 2012    (KR) .................. 10-2012-0125087

(51) Int. Cl.
*H03G 3/00*     (2006.01)
*G10H 7/02*     (2006.01)
*G10L 21/00*    (2013.01)

(52) U.S. Cl.
CPC ............... *H03G 3/00* (2013.01); *G10H 7/02* (2013.01); *G10H 2250/041* (2013.01); *G10L 21/00* (2013.01)

(58) Field of Classification Search
USPC .................... 381/61; 379/406.1; 704/500
See application file for complete search history.

(56) References Cited

U.S. PATENT DOCUMENTS

| | | | | |
|---|---|---|---|---|
| 5,841,875 | A * | 11/1998 | Kuroki ................ | H03F 1/327 381/61 |
| 6,222,110 | B1 * | 4/2001 | Curtis ................ | G10H 1/125 84/735 |
| 6,881,891 | B1 * | 4/2005 | Limacher ............ | G10H 3/187 84/662 |
| 2007/0064923 | A1 * | 3/2007 | Schmukler ......... | H03H 11/265 379/406.1 |

(Continued)

FOREIGN PATENT DOCUMENTS

| | | |
|---|---|---|
| EP | 1 492 081 A1 | 12/2004 |
| SE | EP 1492081 A1 * | 12/2004 ............. G10H 1/125 |

(Continued)

OTHER PUBLICATIONS

Written Opinion dated Mar. 29, 2013 from the International Searching Authority in counterpart application No. PCT/KR/2012/009413.

(Continued)

*Primary Examiner* — Duc Nguyen
*Assistant Examiner* — Yogeshkumar Patel
(74) *Attorney, Agent, or Firm* — Sughrue Mion, PLLC (57) ABSTRACT

A method of emulating a sound of an audio apparatus by using a sound emulation apparatus includes obtaining k past samples (where k is a natural number that is equal to or greater than 1) by delaying a current sample of an audio signal; applying a plurality of characteristic functions indicating an input/output relationship of the audio apparatus to the current sample and the k past samples, respectively; and adding the current sample and the k past samples, to which the plurality of characteristic functions have been applied, respectively, to generate an emulation sound of the audio apparatus.

31 Claims, 7 Drawing Sheets

(56) References Cited

U.S. PATENT DOCUMENTS

2008/0089522 A1* 4/2008 Baba .................. H04S 7/305
                                                    381/17
2009/0150163 A1* 6/2009 Martin ................ H04S 3/002
                                                    704/500

FOREIGN PATENT DOCUMENTS

WO          94/02934  A1       2/1994
WO    WO 9402934  A1 *    2/1994    ............... G10H 1/16

OTHER PUBLICATIONS

International Search Report dated Mar. 29, 2013 from the International Searching Authority in counterpart application No. PCT/KR/2012/009413.

Karjalainen, et al., "Wave Digital Simulation of a Vacuum-Tube Amplifier", Helsinki University of Technology, Laboratory of Acoustics and Audio Signal Processing, 2006, pp. 153-156.

Communication dated Jun. 25, 2015 issued by the European Patent Office in counterpart European Patent Application No. 12847151.3.

* cited by examiner

METHOD AND APPARATUS FOR EMULATING SOUND

CROSS-REFERENCE TO RELATED PATENT APPLICATIONS

This application claims the benefit of U.S. Provisional Patent Application No. 61/557,605, filed on Nov. 9, 2011, in the U.S. Patent and Trademark Office, and Korean Patent Application No. 10-2012-0125087, filed on Nov. 6, 2012, in the Korean Intellectual Property Office, the disclosures of which are incorporated herein in their entirety by reference.

BACKGROUND

1. Field

Exemplary embodiments disclosed herein relate to a method and apparatus for emulating a sound of an audio apparatus, and more particularly, to a method and apparatus for exactly reproducing a sound of an expensive audio apparatus, such as a vacuum tube amplifier or the like.

2. Description of the Related Art

A sound emulation apparatus is an apparatus for reproducing a sound of an audio device which outputs a unique sound. In detail, when an audio signal is input to the sound emulation apparatus, the sound emulation apparatus changes the input audio signal to output the same sound as a sound output from an audio apparatus.

A typical sound emulation apparatus uses a wave digital filter method for generating a characteristic function of an audio apparatus in consideration of the characteristics of both passive and active devices included in the audio apparatus. However, in the wave digital filter method, since the characteristics of all devices included in the audio apparatus need to be determined, a system using the wave digital filter method can become very complicated, and the amount of calculations performed by the system increases.

Accordingly, there is a need for a method of emulating a sound of an audio apparatus with low system complexity and high precision.

SUMMARY OF THE INVENTION

Exemplary embodiments provide a method and apparatus for emulating a sound, and more particularly, for emulating a sound of an audio apparatus with low system complexity and high precision.

According to an exemplary embodiment, there is provided a method of emulating a sound of an audio apparatus by using a sound emulation apparatus, the method including obtaining k past samples (where k is a natural number that is equal to or greater than 1) by delaying a current sample of an audio signal; applying a plurality of characteristic functions indicating an input/output relationship of the audio apparatus to the current sample and the k past samples, respectively; and adding the current sample and the k past samples, to which the plurality of characteristic functions have been applied, respectively, to generate an emulation sound of the audio apparatus.

The obtaining of the k past samples may include obtaining the k past samples by inputting the current sample to k delay modules.

k may be a natural number that is equal to or greater than 2, and the obtaining of the k past samples may include obtaining a first past sample by inputting the current sample to a delay module and obtaining a second past sample by inputting the first past sample to the delay module.

k may be a natural number that is equal to or greater than 2, and the obtaining of the k past samples may include obtaining a first past sample by inputting the current sample to a first delay module and obtaining a second past sample by inputting the first past sample to a second delay module.

The first delay module and the second delay module may have a same delay degree.

The plurality of characteristic functions may include a nonlinear polynomial function.

The plurality of characteristic functions may include a look-up table indicating the input/output relationship of the audio apparatus.

The method may further include inputting an input test signal to the audio apparatus and receiving an output test signal from the audio apparatus to obtain a characteristic function indicating a relationship between the input test signal and the output test signal.

According to another exemplary embodiment, there is provided a method of emulating a sound of an audio apparatus by using a sound emulation apparatus, the method including applying a characteristic function indicating an input/output relationship of the audio apparatus to a current sample of an audio signal; obtaining k past samples by delaying the current sample to which the characteristic function has been applied; and generating an emulation sound of the audio apparatus by adding the current sample to which the characteristic function has been applied and the k past samples.

The generating of the emulation sound may include multiplying a weight by each of the k past samples; and generating the emulation sound of the audio apparatus by adding the k past samples multiplied by the weight and the current sample to which the characteristic function has been applied.

According to another exemplary embodiment, there is provided a method of emulating a sound of an audio apparatus by using a sound emulation apparatus, the method including applying a characteristic function indicating an input/output relationship of the audio apparatus to a current sample of an audio signal, obtaining k past samples to which the characteristic function has been applied, from a queue memory unit of the sound emulation apparatus, and generating an emulation sound of the audio apparatus by adding the current sample to which the characteristic function has been applied and the k past samples to which the characteristic function has been applied.

The method may further include storing, in the queue memory unit, the k past samples to which the characteristic function has been applied, in an order in which the k past samples are input to the sound emulation apparatus.

According to another exemplary embodiment, there is provided a non-transitory computer readable recording medium having recorded thereon a program for executing the method.

According to another exemplary embodiment, there is provided an apparatus which emulates a sound of an audio apparatus, the apparatus including a sample delayer which obtains k past samples (where k is a natural number that is equal to or greater than 1) by delaying a current sample of an audio signal; a characteristic function applier which applies a plurality of characteristic functions indicating an input/output relationship of the audio apparatus to the current sample and the k past samples, respectively; and an adder which adds the current sample and the k past samples, to which the plurality of characteristic functions have been applied, respectively, to generate an emulation sound of the audio apparatus.

The sample delayer may obtain the k past samples by inputting the current sample to k delay modules.

k may be a natural number that is equal to or greater than 2, and the sample delayer may obtain a first past sample by inputting the current sample to a delay module, and may obtain a second past sample by inputting the first past sample to the delay module.

k may be a natural number that is equal to or greater than 2, and the sample delayer may obtain a first past sample by inputting the current sample to a first delay module, and may obtain a second past sample by inputting the first past sample to a second delay module.

The first delay module and the second delay module may have a same delay degree.

The plurality of characteristic functions may include a nonlinear polynomial function.

The plurality of characteristic functions may include a look-up table indicating the input/output relationship of the audio apparatus.

The method may further include a characteristic function obtainer which inputs an input test signal to the audio apparatus and receives an output test signal from the audio apparatus to obtain a characteristic function indicating a relationship between the input test signal and the output test signal.

According to another exemplary embodiment, there is provided an apparatus for emulating a sound of an audio apparatus, the apparatus including a characteristic function applier which applies a characteristic function indicating an input/output relationship of the audio apparatus to a current sample of an audio signal; a sample delayer which obtains k past samples by delaying the current sample to which the characteristic function has been applied; and an adder which generates an emulation sound of the audio apparatus by adding the current sample to which the characteristic function has been applied and the k past samples.

The adder may multiply a weight by each of the k past samples, and may generate the emulation sound of the audio apparatus by adding the k past samples multiplied by the weight and the current sample to which the characteristic function has been applied.

According to another exemplary embodiment, there is provided an apparatus which emulates a sound of an audio apparatus, the apparatus including a characteristic function applier which applies a characteristic function indicating an input/output relationship of the audio apparatus to a current sample of an audio signal, a queue memory unit which obtains k past samples to which the characteristic function has been applied, and an adder which generates an emulation sound of the audio apparatus by adding the current sample to which the characteristic function has been applied and the k past samples to which the characteristic function has been applied.

The queue memory unit may store the k past samples to which the characteristic function has been applied, in an order in which the k past samples are input to the apparatus.

According to another exemplary embodiment, there is provided an apparatus which emulates a sound of an audio apparatus, the apparatus including a power sample obtainer which obtains a first power sample with respect to a current sample of an audio signal; a queue memory which applies a polynomial function indicating an input/output relationship of the audio apparatus to the first power sample and a second power sample with respect to at least one past sample of the audio signal, respectively; and an adder which generates an emulation sound of the audio apparatus by adding the first power sample to which the polynomial function has been applied and the second power sample to which the polynomial function has been applied.

The queue memory may include a sample storage unit which stores the second power sample with respect to the at least one past sample of the audio signal; and a function applier which applies a first polynomial function of the audio apparatus to the first power sample and applies at least one second polynomial function of the audio apparatus to the second power sample.

The sample storage may store power samples in an order in which past samples corresponding to the power samples are input to the sound emulation apparatus.

According to another exemplary embodiment, a method of generating, by a sound emulator, an emulation sound which corresponds to a sound output by an external audio apparatus, includes: modifying a current sample and a delayed sample based on a relationship between an input signal input to, and a corresponding output signal output from, the external audio apparatus; and generating the emulation sound based on the modified current sample and the modified delayed sample.

BRIEF DESCRIPTION OF THE DRAWINGS

The above and other features and advantages of the exemplary embodiments will become more apparent by describing in detail exemplary embodiments with reference to the attached drawings in which.

DETAILED DESCRIPTION OF THE INVENTION

Hereinafter, the exemplary embodiments will be described more fully with reference to the accompanying drawings, in which exemplary embodiments are shown. The exemplary embodiments may, however, be embodied in many different forms and should not be construed as being limited to the exemplary embodiments set forth herein; rather, these exemplary embodiments are provided so that this disclosure will be thorough and complete, and will fully convey the concept of the exemplary embodiments to those of ordinary skill in the art. Throughout this specification, like reference numerals in the drawings denote like elements.

The term "unit" in the exemplary embodiments may refer to a software component or a hardware component, such as a field-programmable gate array (FPGA) or an application-specific integrated circuit (ASIC), that performs a specific function. However, the term "unit" is not limited to software or hardware. The "unit" may be formed so as to be stored in an addressable storage medium, or may be formed so as to operate one or more processors. Thus, for example, the term "unit" may refer to components such as software components, object-oriented software components, class components, and task components, processes, functions, properties, procedures, subroutines, segments of program codes, drivers, firmware, micro codes, circuits, data, databases, data structures, tables, arrays, and parameters. Functions provided by elements and "units" may be combined in a smaller number of elements and "units" or may be separated into additional elements and "units".

According to exemplary embodiments, throughout this specification, the term "audio apparatus" may refer to an audio apparatus for outputting a sound that is subject to emulation by a sound emulation apparatus according to an exemplary embodiment.

Figure 1:
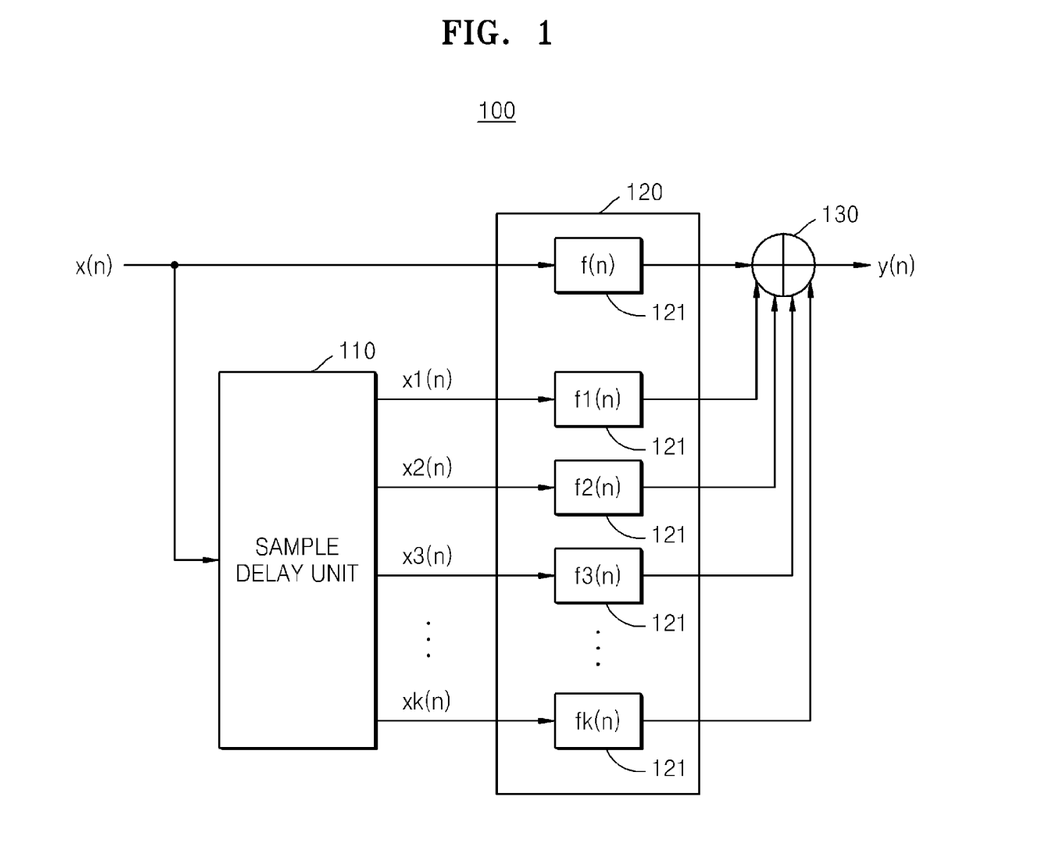
FIG. 1 is a structural diagram of a sound emulation apparatus according to an exemplary embodiment.

FIG. 1 is a structural diagram of a sound emulation apparatus 100 according to an exemplary embodiment.

Referring to FIG. 1, the sound emulation apparatus 100 includes a sample delay unit 110 (also referred to as a "sample delayer"), a characteristic function applying unit 120 (also referred to as a "characteristic function applier"), and an adder 130. The sound emulation apparatus 100 may be included in a digital audio system. The sample delay unit 110, the characteristic function applying unit 120, and the adder 130 may each be configured as a microprocessor, although are not limited thereto.

A current sample x(n) of an audio signal is input to both the sample delay unit 110 and the characteristic function applying unit 120. The audio signal may include, for example, a music signal or a voice signal. The current sample x(n) of the audio signal may include a sample at a predetermined point of time of a digital audio signal that is input to the sound emulation apparatus 100.

The sample delay unit 110 may delay the current sample x(n) of the audio signal to obtain k past samples (delayed samples) (where k is a natural number that is equal to or greater than 1). According to an exemplary embodiment, a past sample refers to a sample that has been input to the sound emulation apparatus 100 prior to the current sample x(n).

The k past samples may have the same sample interval or may have different predetermined sample intervals. For example, when a first past sample $x1(n)$, a second past sample $x2(n)$, and a third past sample $x3(n)$ correspond to x(n−1*d), x(n−2*d), and x(n−3*d), respectively, the k past samples may have the same sample interval. Such a delay method is referred to as an equal delay method. Alternatively, the first past sample $x1(n)$, the second past sample $x2(n)$, and the third past sample $x3(n)$ correspond to x(n−d1), x(n−d2), and x(n−d3), respectively, the k past samples may have different sample intervals. Such a delay method is referred to as a non-equal delay method. A user may adjust a delay degree of a delay module 111 included in the sample delay unit 110 and may determine sample intervals between the k past samples.

A detailed operation of the sample delay unit 110 will be described below with reference to FIGS. 2 through 5.

The characteristic function applying unit 120 applies a plurality of characteristic functions 121 indicating an input/output relationship of an audio apparatus to the current sample x(n) and the k past samples, respectively.

The characteristic functions 121 indicate a relationship between an input signal and an output signal of the audio apparatus when a predetermined signal is input to the audio apparatus. When the characteristic functions 121 are applied to the input signal, harmonic signals may be output and may be combined with each other to generate a similar output signal to the output signal of the audio apparatus. Thus, the characteristic functions 121 may modify the input signal.

Figure 2A:
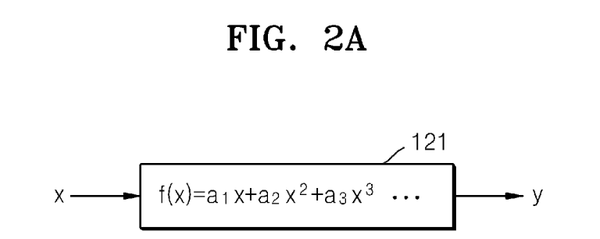
FIGS. 2A and 2B are diagrams of a characteristic function according to a sound emulation apparatus, according to exemplary embodiments.
Figure 2B:
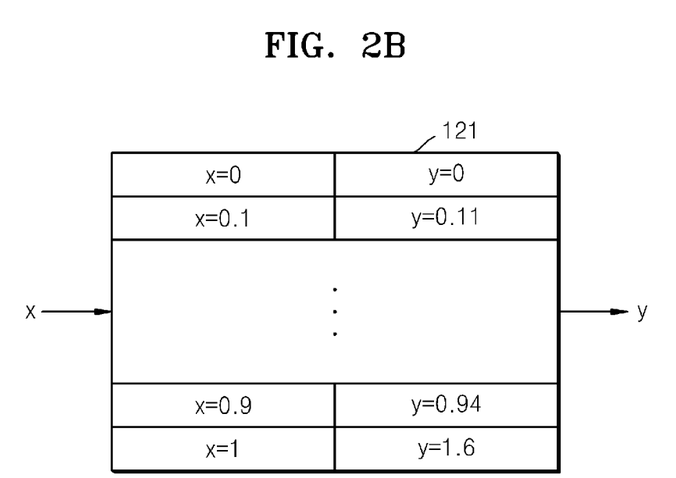

FIGS. 2A and 2B are diagrams of a characteristic function 121 according to the sound emulation apparatus 100, according to exemplary embodiments.

The characteristic function 121 of an audio apparatus may be represented by a nonlinear function between an input signal and an output signal. According to an exemplary embodiment, the characteristic function 121 shown in FIG. 2A is represented by a nonlinear polynomial indicating an input/output relationship of the audio apparatus, although it is understood that the nonlinear polynomial shown in FIG. 2A is exemplary only.

When the characteristic function 121 shown in FIG. 2A is applied to a current sample of an audio signal, a square, a cube, etc. of the current sample value are obtained. When a subsequent sample of the audio signal is input to the characteristic function applying unit 120, the square, the cube, etc. of the subsequent sample value may be used as a square, a cube, etc. of a past sample value. Thus, in order to prevent repeated calculation of a square, a cube, etc., the square, the cube, etc. of the current sample value may be stored in a memory (not shown).

Alternatively, the characteristic function 121 may be represented by a look-up table, as shown in FIG. 2B. The look-up table stores a predetermined output value y with respect a predetermined input value x. For example, when the characteristic function 121 shown in FIG. 2B is applied to an input value x equaling 0.9, an output value y equaling 0.94 is output.

The plurality of characteristic functions 121 contained in the characteristic function applying unit 120 shown in FIG. 1 may correspond to samples to which the characteristic functions 121 are to be applied, respectively. That is, a characteristic function f(n) may correspond to the current sample x(n), a characteristic function $f1(n)$ may correspond to the first past sample $x1(n)$, a characteristic function $f2(n)$ may correspond to the second past sample $x2(n)$, etc.

The adder 130 adds a current sample f(x(n)) to which the characteristic function 121 is applied, and the k past samples $f1(x1(n))$, $f2(x2(n))$ through fk(xk(n)) to which the characteristic function 121 is applied, to generate an emulation sound of the audio apparatus.

Although not shown in FIG. 1, the sound emulation apparatus 100 may further include a speaker for reproducing the emulation sound.

According to exemplary embodiments, the emulation sound may be generated in consideration of past samples that have been input previously, as well as the current sample x(n) input to the sound emulation apparatus 100. Since the audio apparatus which outputs the sound to be emulated by the sound emulation apparatus 100 includes an active device and a passive device, a sample that was input in the past may remain in these devices. Thus, if the emulation sound is generated in consideration of the current sample x(n) only, without considering the remaining samples, a sound of the audio apparatus may not be reproduced exactly. Thus, according to an exemplary embodiment, the sound emulation apparatus 100 may apply the characteristic function 121 corresponding to a current sample to the current sample x(n) and may apply the characteristic function 121 corresponding to a past sample to generate an emulation sound that more closely corresponds to the sound of the audio apparatus.

Although not shown in FIG. 1, the sound emulation apparatus 100 may further include a characteristic function obtaining unit (also referred to as a "characteristic function obtainer") for obtaining the characteristic functions 121 of the audio apparatus.

The characteristic function obtaining unit may input an input test signal to the audio apparatus, receive an output test signal output from the audio apparatus, and obtain the characteristic functions 121 indicating a relationship between the input test signal and the output test signal. The characteristic function obtaining unit may transmit the characteristic functions 121 to the characteristic function applying unit 120.

The characteristic function obtaining unit may obtain the characteristic function 121 corresponding to a current sample of the audio signal by using a relationship between a current output test sample and a current input test sample input to the audio apparatus and may obtain the characteristic function 121 corresponding to a past sample by using a relationship between a past input test sample and the current output test sample. The characteristic functions 121 may be obtained in various ways within the scope of what would be understood by one of ordinary skill in the art.

Hereinafter, the sample delay unit 110 shown in FIG. 1 will be described.

Figure 3:
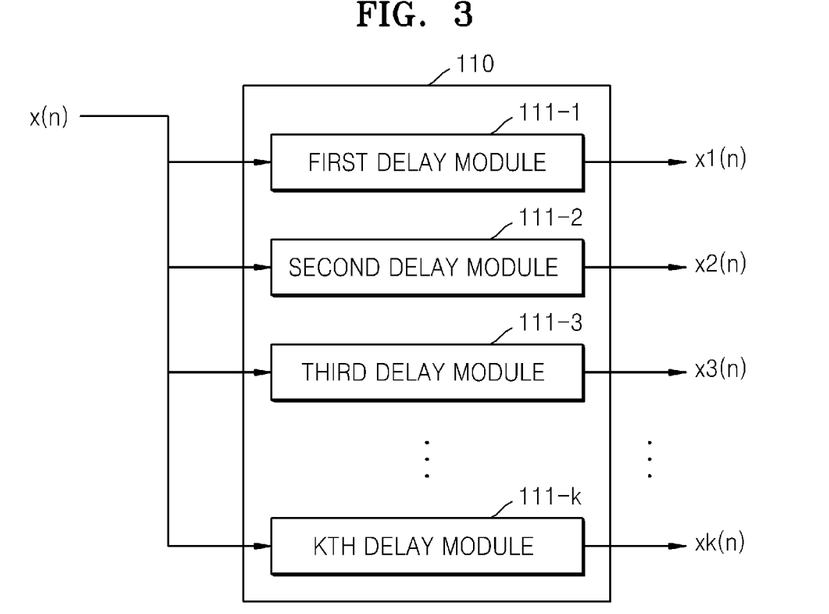
FIG. 3 is a structural diagram of a sample delay unit shown in FIG. 1, according to an exemplary embodiment.

FIG. 3 is a structural diagram of the sample delay unit 110 shown in FIG. 1, according to an exemplary embodiment.

Referring to FIG. 3, the current sample x(n) of the audio signal is input to a plurality of delay modules 111-1, 111-2, through 111-$k$ which output the k past samples.

The plurality of delay modules 111-1, 111-2, through 111-$k$ of the sample delay unit 110 may have different delay degrees. According to an exemplary embodiment, a delay degree refers to a degree by which a delay module delays a sample input to the delay module.

In detail, a first delay module 111-1 may have a first delay degree, a second delay module 111-2 may have a second delay degree, and a $k_{th}$ delay module 111-$k$ may have a $k_{th}$ delay degree. Thus, the first past sample x1($n$) that passes through the first delay module 111-1 may be represented by x(n−1), the second past sample x2($n$) that passes through the second delay module 111-2 may be represented by x(n−2), and a $k_{th}$ past sample xk(n) that passes through the $k_{th}$ delay module 111-$k$ may be represented by x(n−k).

Figure 4:
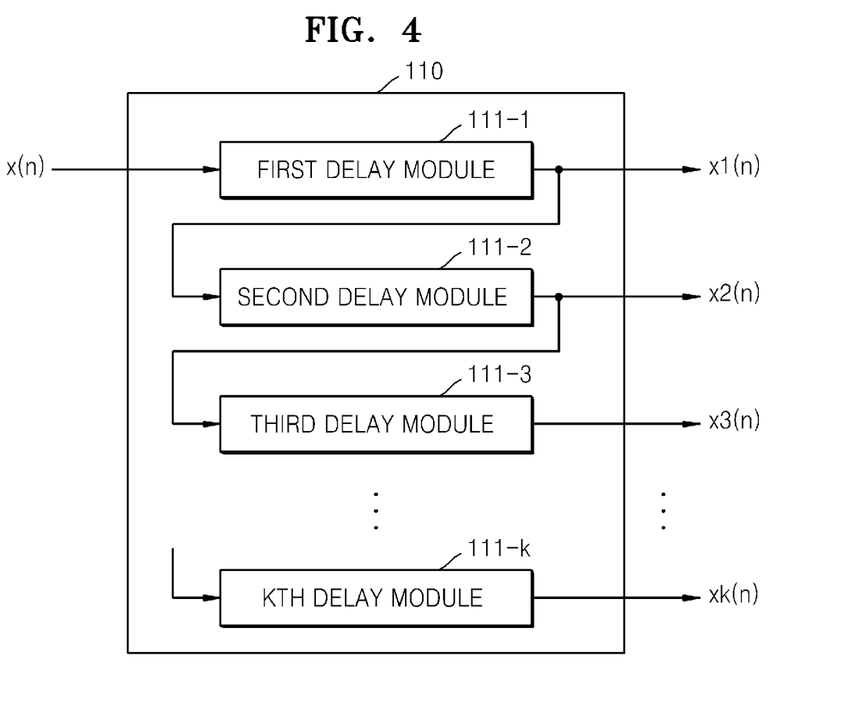
FIG. 4 is a structural diagram of a sample delay unit shown in FIG. 1, according to another exemplary embodiment.

FIG. 4 is a structural diagram of the sample delay unit 110 shown in FIG. 1, according to another exemplary embodiment.

Referring to FIG. 4, the current sample x(n) may be input to the first delay module 111-1 and may be output as the first past sample x1($n$). The first past sample x1($n$) may be input to the second delay module 111-2 and may be output as the second past sample x2($n$). As shown in FIG. 4, the sample delay unit 110 may include delay modules 111 having the same delay degree. In this case, since a first past sample x1($n$) output from the first delay module 111-1 is delayed by the second delay module 111-2, a second past sample x2($n$) is more delayed than the first past sample x1($n$).

Alternatively, the sample delay unit 110 shown in FIG. 4 may be configured in such a way that the delay modules 111 may have different delay degrees. That is, if a delay degree for most precisely reproducing a sound of the audio apparatus is determined by experimentation or the like, delay degrees of the delay modules 111 may be set accordingly.

Figure 5:
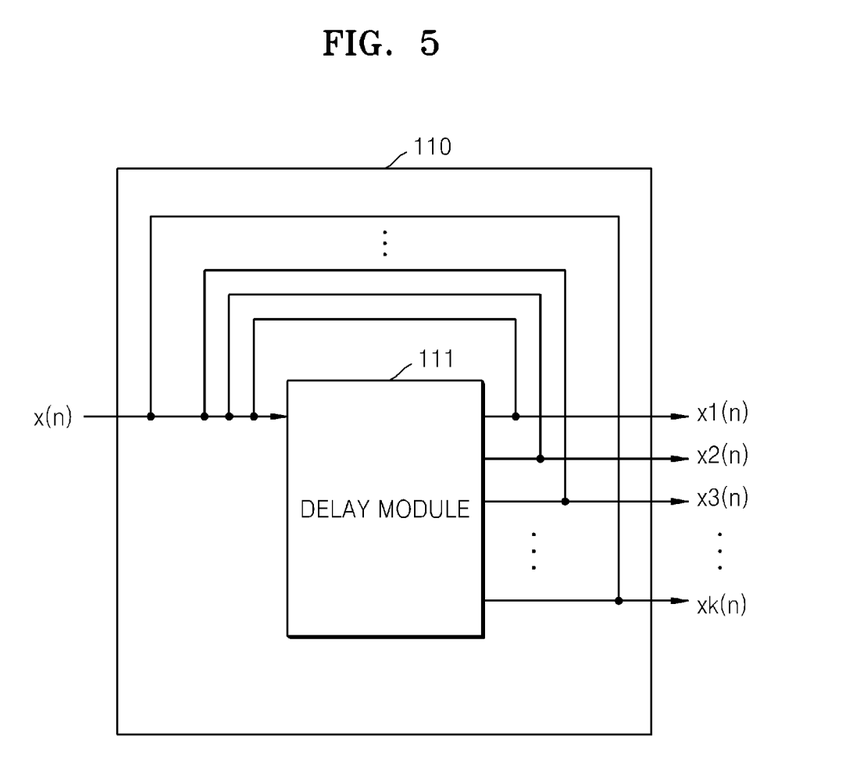
FIG. 5 is a structural diagram of a sample delay unit shown in FIG. 1, according to another exemplary embodiment.

FIG. 5 is a structural diagram of the sample delay unit 110 shown in FIG. 1, according to another exemplary embodiment.

The sample delay unit 110 shown in FIG. 5 may include a single delay module 111, unlike the sample delay unit 110 shown in FIGS. 3 and 4. A past sample output from the delay module 111 may be input to the delay module 111 as feedback. Accordingly, since the sample delay unit 110 includes only a single delay module 111, system complexity may be lowered.

According to an exemplary embodiment, the sound emulation apparatus 100 may further include an oversampling unit (not shown) for oversampling an audio signal and a downsampling unit (not shown) for downsampling an emulation sound generated from the sound emulation apparatus 100, when an audio signal input to the sound emulation apparatus 100 is an analog signal.

When the characteristic function 121 is applied to a current sample and a past sample, harmonics having a higher frequency than a frequency of the current sample and the past sample are generated. In this case, when an analog audio signal is simply sampled according to the Nyquist theorem, aliasing may occur. Thus, the sound emulation apparatus 100 may further include the oversampling unit for oversampling an analog signal to have a higher frequency than a sampling frequency according to the Nyquist theorem before the analog signal is input to the characteristic function applying unit 120, and the downsampling unit for downsampling the emulation sound generated by the adder 130.

Figure 6:
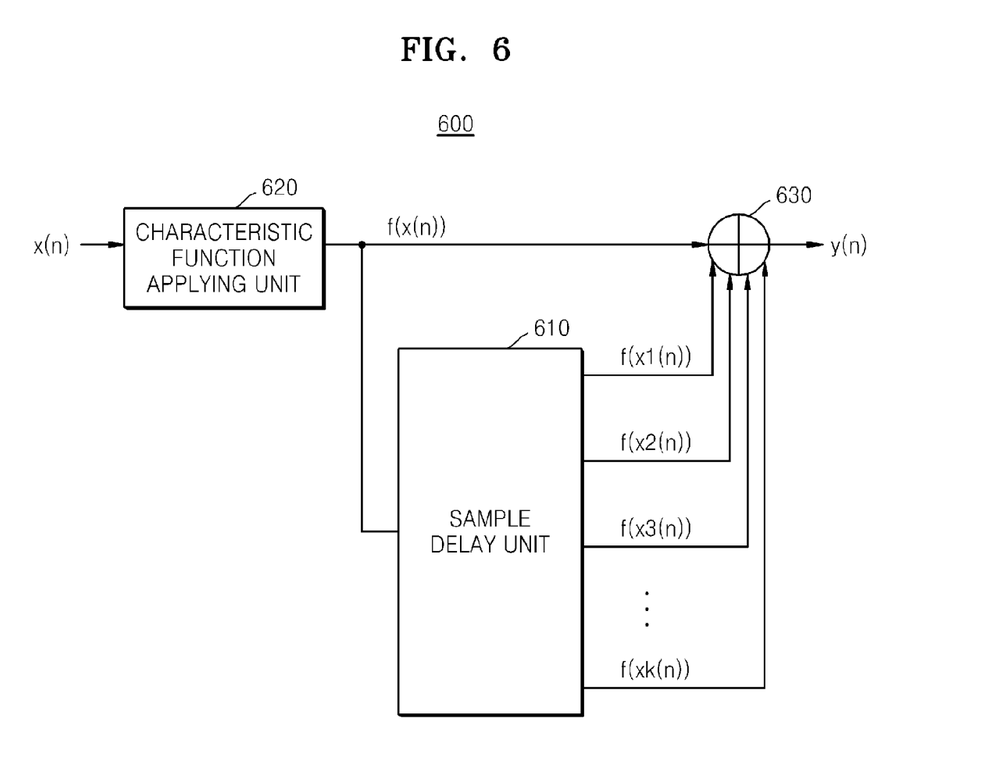
FIG. 6 is a structural diagram of a sound emulation apparatus according to another exemplary embodiment.

FIG. 6 is a structural diagram of a sound emulation apparatus 600 according to another exemplary embodiment.

Referring to FIG. 6, the sound emulation apparatus 600 shown in FIG. 6 includes a characteristic function applying unit 620, a sample delay unit 610, and an adder 630, similar to the sound emulation apparatus 100 of FIG. 1.

The sound emulation apparatus 100 of FIG. 1 is configured in consideration that a past sample is output from the sample delay unit 110 prior to passing through the characteristic function applying unit 120. On the other hand, the sound emulation apparatus 600 of FIG. 6 is configured in consideration that a past sample is output from the sample delay unit 610 after passing through the characteristic function applying unit 620.

The characteristic function applying unit 620 may apply the characteristic function 121 to the current sample x(n) of the audio signal. Unlike the characteristic function applying unit 120 of FIG. 1, according to an exemplary embodiment, the characteristic function applying unit 620 of FIG. 6 includes only a single characteristic function 121. Thus, the amount of calculations performed by the sound emulation apparatus 100 may be reduced in comparison to the amount of calculations performed by the sound emulation apparatus 100 of FIG. 1.

The sample delay unit 610 may delay the current sample f(x(n)) to which the characteristic function 121 is applied to obtain past samples to which k characteristic functions 121 are applied.

A first past sample f(x1($n$)) to which the characteristic function 121 is applied may be represented by f(x(n−d1)), a second past sample f(x2($n$)) may be represented by f(x(n−d2)), and a $k_{th}$ past sample f(xk(n)) may be represented by f(x−d3).

The sample delay unit 610 shown in FIG. 6 has the same structure as that of the sample delay unit 110 shown in FIGS. 3 to 5, except that an input sample is the current sample f(x(n)) to which the characteristic function 121 has already been applied, instead of the current sample x(n) itself.

The sample delay unit 610 shown in FIG. 6 may delay the current sample f(x(n)) to which the characteristic function 121 is applied to obtain the k past samples to which the characteristic function 121 is applied. Alternatively, the sample delay unit 610 may be implemented as a queue memory and may output the k past samples to which the characteristic function 121 is applied. That is, the sample delay unit 610 may store the k past samples to which the characteristic function 121 is applied, in an order in which the k past samples are input to the sound emulation apparatus 600 and may simply output the k past samples, thereby reducing the time taken to generate an emulation sound. Thus, a current sample to which the characteristic function 121 shown in FIG. 6 is applied may be stored in the sample delay unit 610. When a subsequent sample is input to the sound emulation apparatus 600, the stored sample to which the characteristic function 121 has been applied may be used as a first past sample to which the characteristic function 121 is applied.

The adder 630 may add the current sample f(x(n)) to which the characteristic function 121 is applied and the k past samples to which the characteristic function 121 is applied to generate an emulation sound of the audio apparatus.

When samples that were input in the past remain after the characteristic functions 121 are applied to the samples, values of the samples may gradually decrease as time passes. Thus, the adder 630 may multiply a weight by the k past samples to which the characteristic function 121 is applied and may add the multiplication results to the current sample f(x(n)) to which the characteristic function 121 is applied.

Figure 7:
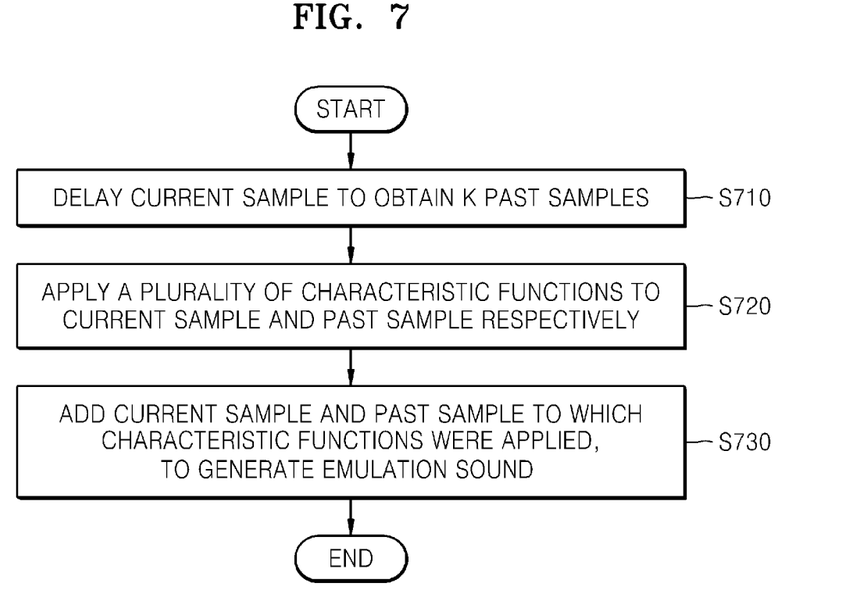
FIG. 7 is a flowchart of a method of emulating a sound, according to an exemplary embodiment.

FIG. 7 is a flowchart of a method of emulating a sound, according to an exemplary embodiment. Referring to FIG. 7, the sound emulation method according to the present exemplary embodiment may include time-series operations performed by the sound emulation apparatus 100 of FIG. 1. Hereinafter, although omitted below, the above detailed description of the sound emulation apparatus 100 of FIG. 1 may be applied to the sound emulation method shown in FIG. 7. It is understood, however, that the method of FIG. 7 is not limited to being performed by the sound emulation apparatus 100 of FIG. 1, and may be performed by other apparatuses as well.

In operation S710, the sound emulation apparatus 100 delays the current sample x(n) of the audio signal to obtain k past samples (where k is a natural number that is equal to or greater than 1). An audio signal may include, for example, a music signal or a voice signal, although is not limited thereto. The current sample may include a sample at a predetermined point of time of a digital audio signal that is input to the sound emulation apparatus 100.

In operation S720, the sound emulation apparatus 100 applies a plurality of characteristic functions to the current sample x(n) and the k past samples respectively. The plurality of characteristic functions may correspond to the current sample x(n) and the k past samples, respectively.

In operation S730, the sound emulation apparatus 100 adds the current sample f(x(n)) and the k past samples, to which the plurality of characteristic functions was applied, to generate an emulation sound.

Figure 8:
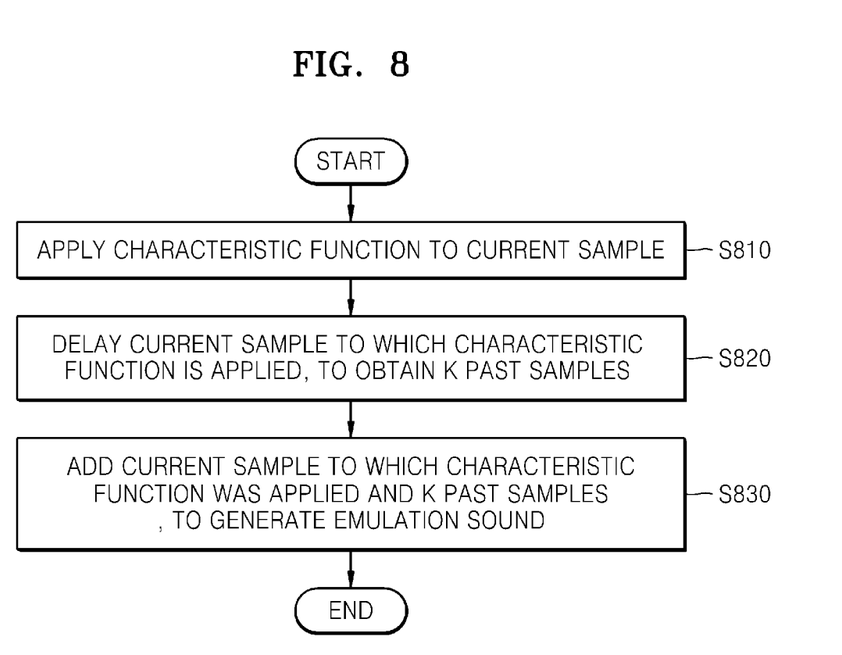
FIG. 8 is a flowchart of a method of emulating a sound, according to another exemplary embodiment.

FIG. 8 is a flowchart of a method of emulating a sound, according to another exemplary embodiment. Referring to FIG. 8, the sound emulation method according to the present exemplary embodiment may include time-series operations performed by the sound emulation apparatus 600 of FIG. 6. Hereinafter, although omitted below, the above detailed description of the sound emulation apparatus 600 of FIG. 6 may be applied to the sound emulation method shown in FIG. 8. It is understood, however, that the method of FIG. 8 is not limited to being performed by the sound emulation apparatus 600 of FIG. 6, and may be performed by other apparatuses as well.

In operation S810, the sound emulation apparatus 600 applies a characteristic function to the current sample x(n) of the audio signal. The characteristic function may correspond to the current sample x(n).

In operation S820, the sound emulation apparatus 600 delays the current sample f(x(n)) to which the characteristic function has been applied, to obtain the k past samples.

In operation S830, the sound emulation apparatus 600 adds the current sample f(x(n)) to which the characteristic function has been applied and the k past samples, to generate an emulation sound of an audio apparatus. The sound emulation apparatus 600 may multiply a predetermined weight by the k past samples and then may add the multiplication results to the current sample f(x(n)) to which the characteristic function has been applied.

Figure 9:
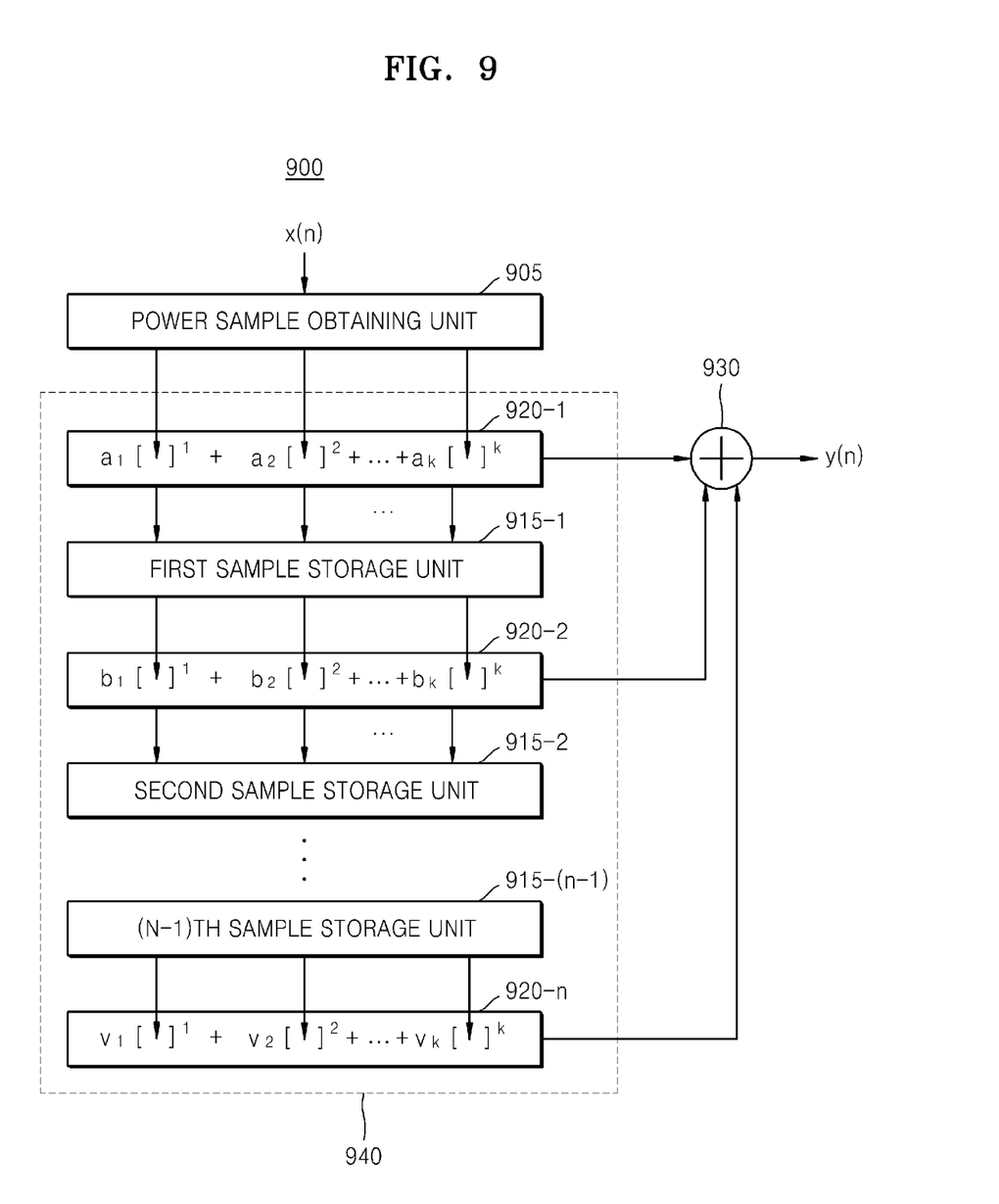
FIG. 9 is a structural diagram of a sound emulation apparatus according to another exemplary embodiment.

FIG. 9 is a structural diagram of a sound emulation apparatus 900 according to another exemplary embodiment.

Referring to FIG. 9, the sound emulation apparatus 900 includes a power sample obtaining unit 905 (also referred to as a "power sample obtainer"), a queue memory unit 940, and an adder 930.

The power sample obtaining unit 905 may obtain a first power sample with respect to a current sample of an audio signal. A power sample refers to a sample obtained by powering a predetermined sample. For example, a powering sample of the current sample x(n) may include $[x(n)]1$, $[x(n)]2$, and $[x(n)]3$ through $[x(n)]k$, although is not limited thereto.

The queue memory unit 940 applies a polynomial function indicating an input/output relationship of the audio apparatus to a first power sample and a second power sample about at least one past sample of an audio signal.

In detail, referring to FIG. 9, the queue memory unit 940 includes one or more function applying units 920-1, 920-2, through 920-*n* (also referred to as "function appliers") and one or more sample storage units 915-1, 915-2, through 915-(*n*−1). In FIG. 9, the one or more function applying units 920-1, 920-2, through 920-*n* and the one or more sample storage units 915-1, 915-2, through 915-(*n*−1) may be physically separated from each other, or alternatively, may each constitute one module.

First, the one or more function applying units 920-1, 920-2, through 920-*n* may apply a polynomial function of the audio apparatus to an input power sample. The polynomial function that is applied to the input power sample by the one or more function applying units 920-1, 920-2, through 920-*n* may correspond to at least one past sample or a current sample of an audio signal corresponding to the power sample.

The one or more sample storage units 915-1, 915-2, through 915-(*n*−1) stores a power sample with respect to at least one past sample of the audio signal. The one or more sample storage units 915-1, 915-2, through 915-(*n*−1) may include a queue memory unit for storing power samples of one or more past samples in an order in which the one or more past samples are input to the sound emulation apparatus 900. That is, a first sample storage unit 915-1 of the one or more sample storage units 915-1, 915-2, through 915-(*n*−1) may store a power sample with respect to a first past sample that is most recently input. In addition, a second sample storage unit 915-2 may store a power sample with respect to a second past sample that is input prior to the first past sample.

A first function applying unit 920-1 of the one or more function applying units 920-1, 920-2, through 920-n may apply a first polynomial function to a power sample of a current sample. In addition, second through $n_{th}$ function applying units 920-2, 920-3, through 920-n may apply second through $n_{th}$ polynomial functions to power samples of past samples stored in the first to $(n-1)_{th}$ sample storage units 915-1, 915-2, through 915-(n-1)).

The adder 930 may add the power sample of the current sample to which the polynomial function has been applied and the power sample about the past sample to which the polynomial function has been applied, to generate an emulation sound of the audio apparatus.

The sound emulation apparatus 900 of FIG. 9 is similar to the sound emulation apparatus 100 of FIG. 1 in that the sound emulation apparatus 900 applies a polynomial function as a characteristic function of an audio apparatus to a current sample and at least one past sample and adds the results to generate an emulation of the audio apparatus. However, the sound emulation apparatus 900 of FIG. 9 is different from the sound emulation apparatus 100 of FIG. 1 in that the sound emulation apparatus 900 may store power samples of past samples in an order in which the power samples are input in the sound emulation apparatus 900, and thus, the power samples may not have to be repeatedly calculated.

The exemplary embodiments may be written as computer programs and may be implemented in general-use digital computers that execute the programs using a computer readable recording medium. Examples of the computer readable recording medium include magnetic storage media (e.g., ROM, floppy disks, hard disks, etc.), and storage media such as optical recording media (e.g., CD-ROMs, or DVDs).

While exemplary embodiments have been particularly shown and described, it will be understood by those of ordinary skill in the art that various changes in form and details may be made therein without departing from the spirit and scope of the exemplary embodiments as defined by the following claims.

What is claimed is:

1. A method of emulating a sound of an audio apparatus by using a sound emulation apparatus, the method comprising:
   obtaining a first sample of an audio signal, the first sample being a sample of the audio signal at a first point of time at which the audio signal is obtained by the sound emulation apparatus;
   delaying the first sample by a sampling interval;
   obtaining a second sample of the audio signal, the second sample being a sample of the audio signal second point of time at which the audio signal is obtained by the sound emulation apparatus, the second point in time being after the first point in time by the sampling interval;
   applying a first characteristic function mapping an input value of the first sample input to the audio apparatus to an output value of the first sample output by the audio apparatus to obtain a first harmonic signal and a second characteristic function mapping an input value of the second sample input to the audio apparatus to an output value of the second sample output by the audio apparatus to obtain a second harmonic signal; and
   adding the first harmonic signal and the second harmonic signal to generate an emulation sound of the audio apparatus.

2. The method of claim 1, wherein the delaying comprises delaying the first sample by inputting the first sample a delay module.

3. The method of claim 2, further comprising:
   delaying the first sample by a second sampling interval by inputting the first sample to the delay module;
   delaying the second sample by the sampling interval by inputting the second sample to the delay module; and
   obtaining a third sample of the audio signal, the third sample being a sample of the audio signal at a third point of time at which the audio signal is obtained by the sound emulation apparatus, the third point in time being after the second point in time by the sampling interval.

4. The method of claim 2, further comprising:
   delaying the first sample by a second sampling interval by inputting the first sample to a second delay module;
   delaying the second sample by the sampling interval by inputting the second sample to the delay module; and
   obtaining a third sample of the audio signal, the third sample being a sample of the audio signal at third point of time at which the audio signal is obtained by the sound emulation apparatus, the third point in time being after the second point in time by the sampling interval.

5. The method of claim 4, wherein the first delay module and the second delay module have a same delay.

6. The method of claim 1, wherein the first characteristic function is a nonlinear function mapping the input value of the first sample input to the audio apparatus to an output value of the first sample output by the audio apparatus and the second characteristic function is a nonlinear function mapping an input value of the second sample input to the audio apparatus to an output value of the second sample output by the audio apparatus.

7. The method of claim 1, wherein the first characteristic function is a first loop table and the second characteristic function is a second lookup table.

8. The method of claim 1, further comprising:
   inputting an input test signal to the audio apparatus and receiving an output test signal from the audio apparatus to obtain at least one of the first characteristic function and the second characteristic function.

9. A method of emulating a sound of an audio apparatus by using a sound emulation apparatus, the method comprising:
   obtaining a first sample of an audio signal, the first sample being a sample of the audio signal at a first point of time at which the audio signal is obtained by the sound emulation apparatus;
   applying a characteristic function mapping an input value of the first sample input to the audio apparatus to an output value of the first sample output by the audio apparatus to obtain a harmonic signal;
   delaying the harmonic signal by a sampling interval;
   obtaining a second sample of the audio signal, the second sample being a sample of the audio signal at a second point of time at which the audio signal is obtained by the sound emulation apparatus, the second point in time being after the first point in time by the sampling interval; and
   generating an emulation sound of the audio apparatus by adding the harmonic signal to the second sample.

10. The method of claim 9, wherein the generating of the emulation sound further comprises:
   multiplying the harmonic signal by a weight proportional to the sampling interval; and
   generating the emulation sound of the audio apparatus by adding the weighted harmonic signal to the second sample.

11. A method of emulating a sound of an audio apparatus by using a sound emulation apparatus, the method comprising:
   obtaining a first sample of an audio signal, the first sample being a sample of the audio signal at a first point of time at which the audio signal is obtained by the sound emulation apparatus;
   applying a characteristic function mapping an input value of the first sample input to the audio apparatus to an output value of the first sample output by the audio apparatus to obtain a first harmonic signal;
   obtaining a second harmonic signal of a second sample to which the characteristic function has been applied, the second sample being a sample of the audio signal at a second point of time at which the audio signal is obtained by the sound emulation apparatus, the second point in time being before the first point in time by the sampling interval, from a queue memory unit of the sound emulation apparatus; and
   generating an emulation sound of the audio apparatus by adding the first harmonic signal to the second harmonic signal.

12. The method of claim 11, wherein the queue memory unit stores a plurality of harmonic signals corresponding to a plurality of sample signals, and the plurality of harmonic signals are stored in the queue memory unit
   in an order in which the plurality of sample signals are input to the sound emulation apparatus.

13. A non-transitory computer readable recording medium having recorded thereon a program for executing the method of claim 1.

14. A sound emulation apparatus which emulates a sound of an audio apparatus, the apparatus comprising:
   at least one processor configured to:
      obtain a first sample of an audio signal, the first sample being a sample of the audio signal at a first point of time at which the audio signal is obtained by the sound emulation apparatus;
      delay the first sample by a sampling interval;
      obtain a second sample of the audio signal, the second sample being a sample of the audio signal at a second point of time at which the audio signal is obtained by the sound emulation apparatus, the second point in time being after the first point in time by the sampling interval;
      apply a first characteristic function mapping an input value of the first sample input to the audio apparatus to an output value of the first sample output by the audio apparatus to obtain a first harmonic signal and a second characteristic function mapping an input value of the second sample input to the audio apparatus to an output value of the second sample output by the audio apparatus to obtain a second harmonic signal; and
      add the first harmonic signal and the second harmonic signal to generate an emulation sound of the audio apparatus.

15. The apparatus of claim 14, wherein the at least one processor delays the first sample by inputting the first sample a delay module.

16. The apparatus of claim 15, wherein the at least one processor delays the first sample by a second sampling interval by inputting the first sample to the delay module, delays the second sample by the sampling interval by inputting the second sample to the delay module, and obtains a third sample of the audio signal, the third sample being a sample of the audio signal at a third point of time at which the audio signal is obtained by the sound emulation apparatus, the third point in time being after the second point in time by the sampling interval.

17. The apparatus of claim 14, wherein the at least one processor delays the first sample by a second sampling interval by inputting the first sample to a second delay module, delays the second sample by the sampling interval by inputting the second sample to the delay module, and obtains a third sample of the audio signal, the third sample being a sample of the audio signal at a third point of time at which the audio signal is obtained by the sound emulation apparatus, the third point in time being after the second point in time by the sampling interval.

18. The apparatus of claim 17, wherein the delay module and the second delay module have a same delay.

19. The apparatus of claim 14, wherein the first characteristic function is a nonlinear function mapping the input value of the first sample input to the audio apparatus to an output value of the first sample output by the audio apparatus and the second characteristic function is a nonlinear function mapping an input value of the second sample input to the audio apparatus to an output value of the second sample output by the audio apparatus.

20. The apparatus of claim 14, wherein the first characteristic function is a first lookup table and the second characteristic function is a second lookup table.

21. The apparatus of claim 14, wherein the at least one processor inputs an input test signal to the audio apparatus and receives an output test signal from the audio apparatus to obtain at least one of the first characteristic function and the second characteristic function.

22. A sound emulation apparatus which emulates a sound of an audio apparatus, the apparatus comprising:
   at least one processor configured to:
      obtain a first sample of an audio signal, the first sample being a sample of the audio signal at a first point of time at which the audio signal is obtained by the sound emulation apparatus;
      apply a characteristic function mapping an input value of the first sample input to the audio apparatus to an output value of the first sample output by the audio apparatus to obtain a harmonic signal;
   delay the harmonic signal by a sampling interval;
   obtain a second sample of the audio signal, the second sample being a sample of the audio signal at a second point of time at which the audio signal is obtained by the sound emulation apparatus, the second point in time being after the first point in time by the sampling interval; and
   generate an emulation sound of the audio apparatus by adding the harmonic signal to the second sample.

23. The apparatus of claim 22, wherein the at least one processor multiplies the harmonic signal by a weight proportional to the sampling interval, and generates the emulation sound of the audio apparatus by adding the weighted harmonic signal to the second sample.

24. A sound emulation apparatus which emulates a sound of an audio apparatus, the apparatus comprising:
at least one processor configured to:
obtain a first sample of an audio signal, the first sample being a sample of the audio signal at a first point of time at which the audio signal is obtained by the sound emulation apparatus:
apply a characteristic function mapping an input value of the first sample input to the audio apparatus an output value of the first sample output by the audio apparatus to obtain a first harmonic signal;
obtain a second harmonic signal of a second sample to which the characteristic function has been applied, the second sample being a sample of the audio signal at a second point of time at which the audio signal is obtained by the sound emulation apparatus, the second point in time being before the first point in time by the sampling interval, from a queue memory; and
generate an emulation sound of the audio apparatus by adding the first harmonic signal to the second harmonic signal.

25. The apparatus of claim 24, wherein the queue memory unit stores a plurality of harmonic signals corresponding to a plurality of sample signals, and the plurality of harmonic signals are stored in the queue memory unit in an order in which the plurality of sample signals are input to the sound emulation apparatus.

26. A sound emulation apparatus which emulates a sound of an audio apparatus, the apparatus comprising:
at least one processor configured to:
obtain a first power sample of an audio signal the first power sample being a powered sample of the audio signal at a first point of time at which the audio signal is obtained by the sound emulation apparatus;
apply a characteristic function mapping an input value of the first power sample input to the audio apparatus to an output value of the first power sample output by the audio apparatus to obtain a harmonic signal;
delay the harmonic signal by a sampling interval;
obtain a second power sample of the audio signal, the second power sample being a sample of the audio signal at a second point of time at which the audio signal is obtained by the sound emulation apparatus, the second point in time being after the first point in time by the sampling interval; and
generate an emulation sound of the audio apparatus by adding the harmonic signal to the second power sample.

27. The apparatus of claim 26, wherein the queue memory comprises:
a sample storage which stores the first power sample and the second power sample.

28. The apparatus of claim 27, wherein the sample storage stores the first power sample and the second power sample in an order in which the first power sample and the second power sample are obtained.

29. A method of generating, by a sound emulator, an emulation sound which corresponds to a sound output by an external audio apparatus, the method comprising:
modifying a current sample of an audio signal and a delayed sample of the audio signal based on a relationship between a value of an input signal input to, and a corresponding value of an output signal output from, the external audio apparatus, the delayed sample being a sample of the audio signal that is received by the sound emulator a sampling interval prior to a time at which the current sample is received by the sound emulator; and
generating the emulation sound by adding the modified current sample and the modified delayed sample.

30. The method of claim 29, further comprising obtaining the delayed sample by delaying the current sample which is received at the sound emulator.

31. The method of claim 29, wherein the modifying comprises applying at least one characteristic function indicating the relationship between the value of the input signal and the corresponding value of the output signal to the current sample and the delayed sample, and
wherein the at least one characteristic function comprises one of a nonlinear polynomial function or a look-up table indicating the relationship.

* * * * *